United States Patent
Keller et al.

[11] 3,930,304
[45] Jan. 6, 1976

[54] METHOD AND APPARATUS FOR SELECTIVE BURNOUT TRIMMING OF INTEGRATED CIRCUIT UNITS

[75] Inventors: Helmut Keller; Hartmut Seiler, both of Reutlingen, Germany

[73] Assignee: Robert Bosch G.m.b.H., Stuttgart, Germany

[22] Filed: Nov. 15, 1973

[21] Appl. No.: 416,216

[30] Foreign Application Priority Data
Nov. 18, 1972 Germany............................ 2256688

[52] U.S. Cl. ...................... 29/574; 29/584; 29/586; 338/195; 29/577
[51] Int. Cl.².......................................... B01J 17/00
[58] Field of Search ........ 29/574, 577, 577 IC, 584, 29/585, 586; 338/195

[56] References Cited
UNITED STATES PATENTS

| | | | |
|---|---|---|---|
| 2,926,418 | 3/1960 | Zuleeg................................. | 29/586 |
| 3,500,148 | 3/1970 | Gunther........................... | 29/577 IC |
| 3,742,592 | 7/1973 | Rizzi................................. | 29/584 |

*Primary Examiner*—W. Tupman
*Attorney, Agent, or Firm*—William R. Woodward

[57] ABSTRACT

Supplementary metallized connection parts short-circuiting or connecting incremental sub-components of one or more circuit elements of an integrated circuit are laid down on the semiconductor slice at the same time as the usual metallized connection pattern is made. The components associated with the incremental sub-components are measured to determine the program of adjustment and selective burnout of the supplementary connections. The selective burnout is carried out by applying a sequence of pulses to the segments to be burned out under monitoring by a measuring circuit, which blocks the delivery of further pulses, either immediately or after one or a few more pulses, when the measuring circuit detects the opening of the connection. The process is preferably carried out on integrated circuits before the semiconductor slice on which they are made is separated into individual circuit units. The pulses are applied in sequences in which individual pulses or series of pulses have increasing amplitude and/or pulse duration and/or pulse frequency.

14 Claims, 16 Drawing Figures

METHOD AND APPARATUS FOR SELECTIVE BURNOUT TRIMMING OF INTEGRATED CIRCUIT UNITS

This invention relates to a method for adjusting electric circuit elements contained in integrated circuit units and an apparatus for carrying out such a method. The adjustment of circuit elements for the purposes of this invention includes the modification of such circuit elements in a programming operation to put the integrated circuit into a form or into one of several forms into which it is designed to be put.

The processing steps involved in the preparation of integrated circuit units are necessarily subject to variations which allow particular electrical parameters, such as, for example, the resistance values of resistor arrangements, the amount of current amplification and the breakdown voltage, to be obtained only within certain tolerance ranges. These tolerances influence the manufacturing yield of satisfactory products and therefore the price of the latter, particularly if narrow absolute tolerances are required.

In order to overcome these difficulties, it is already known to combine such circuits partly with supplementary adjustable elements, such as thin or thick film resistors in the same housing. It is also known to use nickel-chromium resistors that are applied in supplementary work operations to the circuit unit for subsequent trimming or programming by a burnout process. Such techniques in manufacture, in contrast to normal integrated circuit manufacture, involves supplementary work operations which unfavorably influence the cost of manufacture and the yield of satisfactory products.

It is an object of this invention to provide a method for burnout trimming of integrated circuit units that overcomes or avoids the above-described disadvantages.

Subject matter of the present invention

Briefly, supplementary metallic connection paths are formed as part of the metallic connection path pattern of an integrated circuit unit in an arrangement affecting the connection of incremental elements, these supplemental metallic paths being susceptible to burnout, and at a later stage electrical current is applied in a manner suitable for a selective burnout of one or more supplementary paths. In the case of monolithic integrated circuits, it is particularly advantageous to carry out this method at the stage of testing or premeasurement of the semi-conductor slice before it is broken up into individual integrated circuit units: i.e., the subsequent work operations then involve only trimmed or programmed individual chips.

In many cases the burning out of metallic paths produces difficulties, because the conventional connection metallization, preferably of aluminum, has a certain scatter, produced by the manufacturing process, in the geometry and thickness of the corresponding portions of different individual units. Properties such as the specific resistance, the alloying ratios or the like can vary, or else by variation of the geometry and of the material of neighboring layers, the heat conductivity and, particularly when multi-layer metallizing is used, the thickness ratios may vary. If a given amount of electric current is used to burn out a conducting path cross-section of such a metallized path, the operation must be carried out with reference to the least favorable case in order to assure that this particular cross-section will even then be burned out to provide a good separation. In all cases other than this least favorable case, more than the necessary electrical energy will be applied to the cross-section to be burned out. In consequence ejected and partly liquified particles of the connection metallization bespatter the circuit unit, thus impairing the product yield and the product reliability, for example by short-circuit risks. Covering the circuit unit with a glassy coating does not provide a sufficient remedy, because this covering can be torn away at the place of the burnout, so that the short-circuit risk at the unprotected locations thus exposed is still present.

In order to overcome these difficulties, a further development of the invention provides for applying the electric energy to the supplementary conduction paths in the form of a sequence of separate pulses. In that way the burnout procedure can be carried out automatically with the least possible expenditure of energy, thus avoiding the above-described disadvantages. It is particularly convenient in this way of carrying out the invention to increase the amplitude and/or the duration and/or the frequency of the pulses progressively with time. The energy content of the first pulse in this operation can be desirably designed for the cross-section of the metallic conducting path which is designed to be burned out with the smallest quantity of energy. A constant direct current can be superimposed on the pulses.

The invention will be further described by way of example with reference to the annexed drawings, in which.

Figure 1:
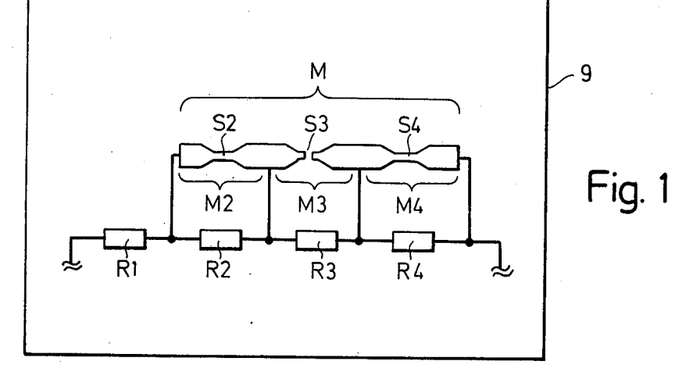
FIG. 1 is a diagrammatic plan view of a portion of a circuit of a monolithic integrated circuit unit provided by an ohmic resistor symbolically shown in the diagram, for explanation of the principle of the invention.

FIG. 1 shows symbolically a portion of a monolithic integrated circuit contained in a silicon semi-conductor body, the boundary of which is represented by the frame symbol 9. An electrical resistor is defined by diffusion of modifying atoms into the semiconductor body, the resistor having the form of a series connection of four component resistors $R_1$, $R_2$, $R_3$ and $R_4$, the composite resistor thus formed being a component of the integrated circuit the rest of which is not shown in the Figure. In order to adjust the resistor to a particular value in ohms, a connecting path M is provided as a portion of the normal metallized connection pattern that is provided in the manufacture of an integrated circuit. The connection path M short circuits the resistor components $R_2$, $R_3$ and $R_4$, while the resistor component $R_1$ is not bridged by the metallization M. As shown in FIG. 1, the portions of connection paths $M_2$, $M_3$ and $M_4$ are formed each of which is associated with one of the resistor components $R_2$, $R_3$ and $R_4$. The connection path segments $M_2$, $M_3$ and $M_4$ each have narrowed down strips $S_2$, $S_3$ and $S_4$. The resistor composed of the resistor portions $R_1$, $R_2$, $R_3$ and $R_4$ is adjusted to a desired ohmic value by means of the short circuiting metallization M by burning out, for example, the narrowed strip $S_3$ by the use of electrical current. The adjusted resistor R then consists of the sum of the resistance parts $R_1$ and $R_3$, while the resistor portions $R_2$ and $R_4$ are short circuited by the conducting path segments $M_2$ and $M_4$.

Figure 2:
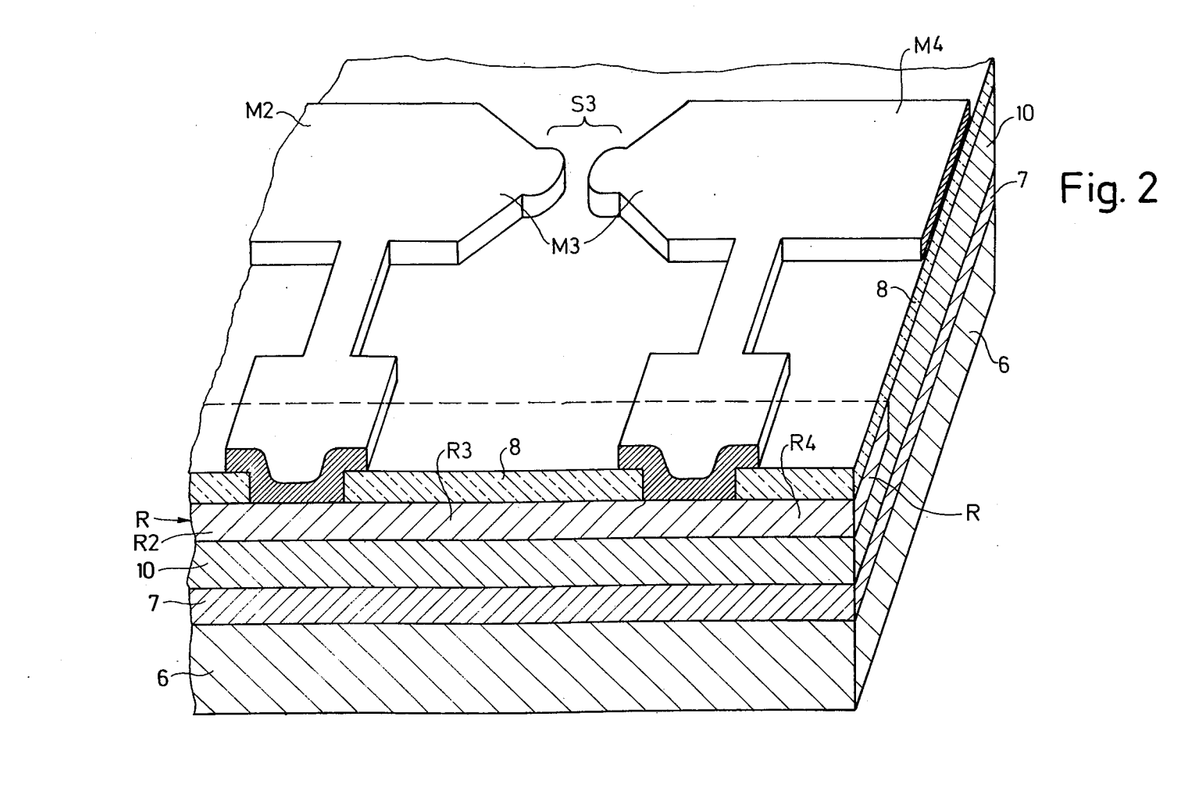
FIG. 2 is a detailed perspective view of a portion of an integrated circuit unit of the type represented by FIG. 1, shown partly in section and partly broken off.

FIG. 2 shows in a perspective view of the semiconductor structure in the neighborhood of the position where the metallic connection path M is burned out. A conducting layer 7 is diffused in a known way into the silicon semi-conducting substrate 6. An epitaxial layer 10 is applied on top of the conducting layer 7 provided on the substrate 6, and then an oxide layer 8, consisting of silicon dioxide, is produced on top of the epitaxial layer 10. Through a correspondingly dimensioned window etched in the oxide layer 8, diffusion is carried out to form the resistor shown in FIG. 1 as a series connection consisting of the resistor portions $R_1$, $R_2$, $R_3$ and $R_4$. It can further be seen from FIG. 2 that the connecting path M is part of the normal connection metallization, i.e. it is applied on top of the oxide layer 8 which is composed of silicon dioxide. For purpose of effecting contact between the connection path M preferably consisting of aluminum and the resistor diffused into the epitaxial layer 10, contact windows are etched into the oxide layer 8 (by this time the original window through which the resistor was made by diffusion has been obliterated by the formation of more oxide). In the area of these contact windows the connection path structure M lies directly on top of the diffused resistor, to that these contact windows in effect subdivide the resistor into resistor portions $R_1$, $R_2$, $R_3$ and $R_4$. In FIG. 2 only the resistor portion $R_3$ and the right and left ends of the resistor portions $R_2$ and $R_4$ respectively are visible, the rest of the structure being broken off or cut away for purposes of illustration.

There will now be described in detail the procedure for adjusting the resistor produced by diffusion into the epitaxial layer 10, with reference to the diagrams of FIG. 3, in which the resistor diffused into the epitaxial layer 10 between the points A and B is treated as being subdivided into five resistor portions $R_1$, $R_2$, $R_3$, $R_4$ and $R_5$. In the starting condition, i.e. before adjustment, all the resistors $R_2$ through $R_5$ are bridged by the metallization M. The required value for the resistor R constituted between the points A and B, for the purpose of this example, is $10k\Omega \pm 600\Omega$. On the basis of the geometry of the layout, the following nominal values are provided for the resistor components $R_1$ through $R_5$ as suitable for an adjustment operation:

$R_1 = 8\ k\Omega$
$R_2 = 4\ k\Omega$
$R_3 = 2\ k\Omega$
$R_4 = 1\ k\Omega$
$R_5 = 0.5\ k\Omega$ It will further be assumed that the possible actual values for these resistors have a scatter of plus or minus 25% as the result of manufacturing conditions. Three actual values are assumed as examples, and for these the final configuration is calculated. The actual value in the first example is, for each component resistor, equal to the nominal value plus 25% of the nominal value; in the second example the actual value is equal to the nominal value minus 25% of the nominal value, and in the third example the actual value is taken as the nominal value itself. Under these assumptions, for these three examples, the actual values are as set forth in Table I.

TABLE I

| ASSUMED ACTUAL RESISTANCE VALUES | | | | |
|---|---|---|---|---|
| $R_1$ [k$\Omega$] | $R_2$ [k$\Omega$] | $R_3$ [k$\Omega$] | $R_4$ [k$\Omega$] | $R_5$ [k$\Omega$] |
| Example 1 (FIG. 4) | | | | |
| 10 | 5 | 2.5 | 1.25 | 0.625 |
| Example 2 (FIG. 5) | | | | |
| 6 | 3 | 1.5 | 0.75 | 0.375 |
| Example 3 (FIG. 6) | | | | |
| 8 | 4 | 2 | 1 | 0.5 |

Figure 3:
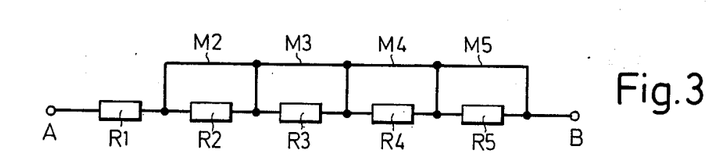
FIG. 3 is a resistance configuration to be adjusted according to the invention.
Figure 4:
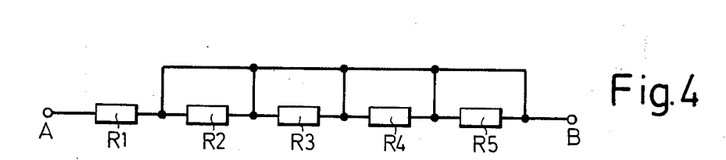
FIGS. 4 through 6 show three different possible results of the adjustment procedure of this invention applied to the resistor configuration of FIG. 3.
Figure 5:
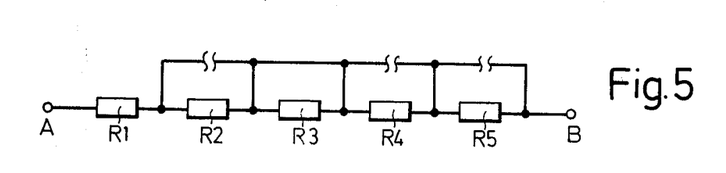
Figure 6:
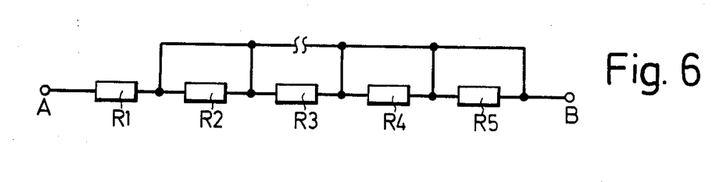

On the basis of the actual resistance values above assumed, which in actuality would be determined by a probe, the adjusted configurations of FIGS. 4, 5 and 6 are obtained in accordance with the invention from the basic configuration of FIG. 3. In Example 1, the connection path M is not interrupted at any point (FIG. 4) and the adjusted value is 10 k$\Omega$. In Example 2 (FIG. 5), the narrowed strips $S_2$, $S_4$ and $S_5$ are burned out. The adjusted value that results in this case is 10,125 k$\Omega$. In Example 3 (FIG. 6), the narrowed strip $S_3$ is burned out. The adjusted value in this case comes out to 10 k$\Omega$.

In this manner it is possible, by adding into circuit with $R_1$ one or more resistors, by interrupting their respective short circuiting bridges, to approximate the design value for the total resistor within the limits of acceptable tolerances. The same principle can also be applied for adjustment of voltage dividers and to programming variations of certain components to suit particular applications. The diffused type resistor in the above-described illustration of the invention can also be replaced by other electrical circuit elements, for example diodes and transistors, and the invention can be used to cut off parallel components as well as to add series components. FIGS. 7, 8, 9 and 10 show circuits that can be used to advantage for carrying out the selective burnout of interruptible connection path segments for the purpose of adjusting a circuit element of an integrated circuit unit. The connection segment in which a burnout is to be produced, as described in the above examples in connection with one or more of the strips $S_2$ through $S_5$, is designated in FIGS. 7, 8, 9 and 10 as $S_i$.

Figure 7:
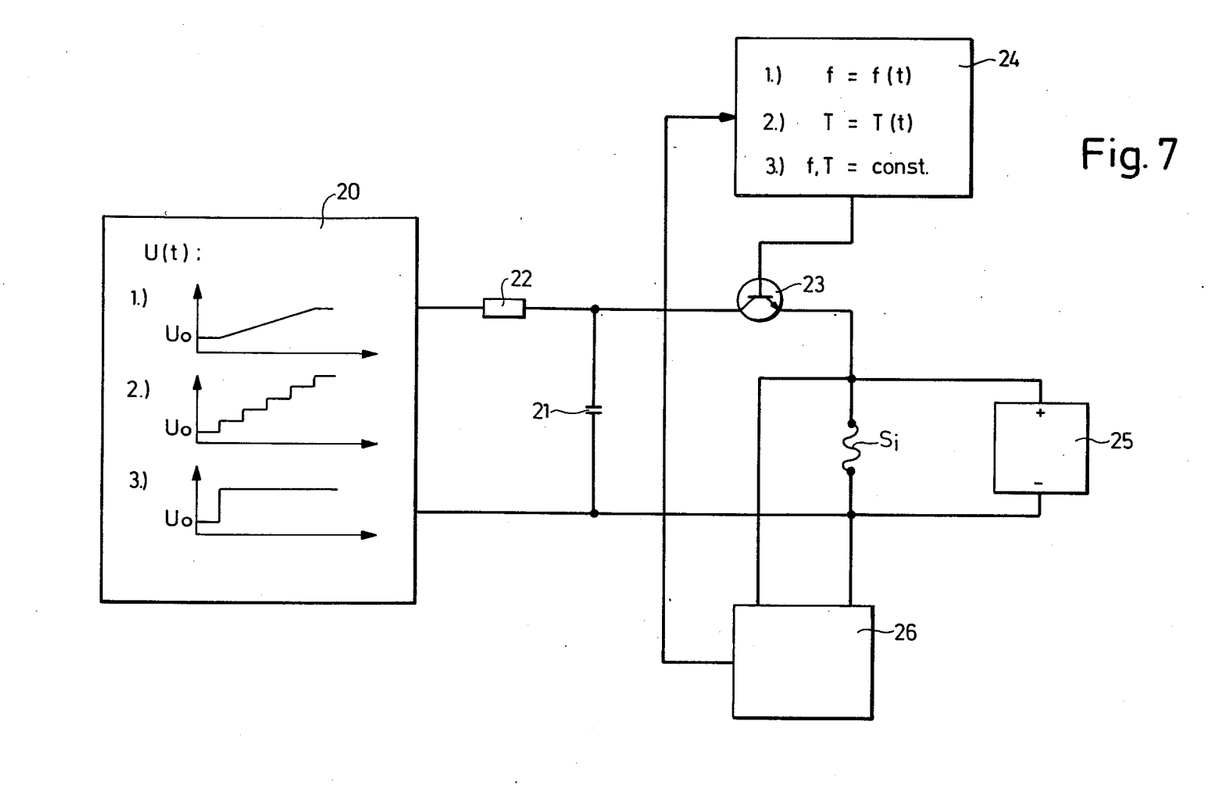
FIGS. 7 through 10 are circuit diagrams embodying the invention for carrying out the method and process thereof.

The circuit shown in FIG. 7 comprises a voltage source 20 which is capable of delivering three different voltage sequences dependent on the time $t$. In the first place, the voltage can rise linearly with time. In the second place, it can increase in stepwise fashion. In the third case, the voltage can be maintained constant. A storage capacitor 21, moreover, is provided to provide buffer storage of energy. The capacitor 21 has one terminal connected to an output terminal directly connected to the voltage source 20 and the other terminal connected over a charging resistor 22 to the other terminal of the voltage source 20. The terminal of the storage capacitor 21, which is connected with the charging resistor 22, is connected also to the collector of a switching transistor 23, of which the emitter is connected to the other terminal of the storage capacitor 21 over the burnout-susceptible strip $S_i$.

A pulse generator 24, constituted as an astable multivibrator, is connected to the base of the switching transistor 23 for the control of the latter. The pulse generator 24 delivers rectangular pulses of a constant frequency $f$ and pulse duration T. The pulse generator can, however, be so constituted that it provides a time-dependent frequency $f_{(t)}$ at a constant pulse duration T or a time-dependent pulse duration $T_{(t)}$ at a constant frequency $f$, or it can even be so provided as to supply pulses of which both the frequency $f$ and the pulse duration T change with time. The variation of the frequency $f_{(t)}$ and/or of the pulse duration $T_{(t)}$ can be either continuous or discontinuous, which is to say either gradual or stepwise. In addition, a constant current source 25 is also connectible to the burnout-susceptible strip $S_i$. A measuring circuit 26, constituted as a Schmitt trigger circuit can also be provided for the measurement of the resistance of the burnout-susceptible strip $S_i$. This circuit provides a blocking pulse either directly or after a time delay to a blocking input of the pulse generator 24 if the resistance of the burnout-susceptible strip $S_i$ has reached the desired value corresponding to an interruption of the strip. The blocking pulse thus provided by the measuring circuit 26 has the effect of preventing the pulse generator 24 from providing anymore pulses to the base of the switching transistor 23, so that no more pulses reach the strip $S_i$. The delay of the blocking pulse that may be used serves the purpose of assuring that at least one additional pulse will be provided to the burnout stretch, in order to assure that this part of the circuit is open.

Figure 8:
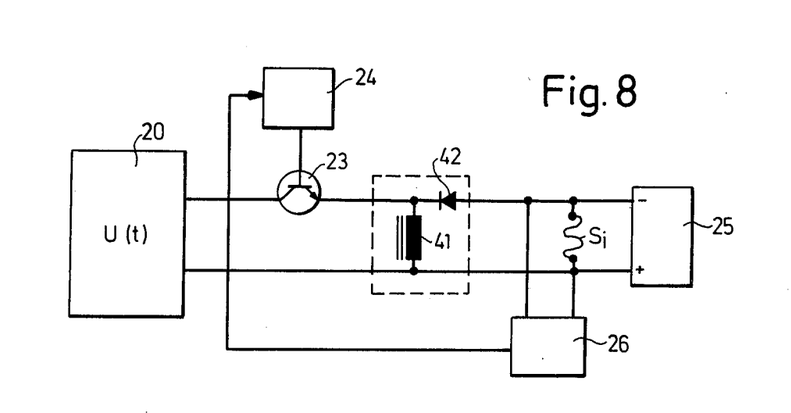

FIG. 8 shows a circuit in which the circuit components 21 and 22 of FIG. 7 are replaced by an inductive energy storage reactor 41 and a reaction facilitating diode 42. The circuit components 41 and 42 are in this case connected behind rather than ahead of the switching transistor 23. The remaining circuit components 24,25 and 26 appearing in FIG. 7 are retained in FIG. 8.

Figure 9:
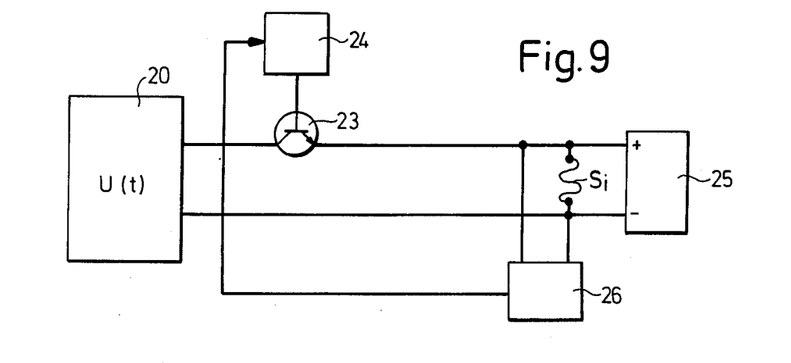

FIG. 9 shows a circuit in which the circuit components 21 and 22 of FIG. 7 are likewise omitted, and the burnout-susceptible strip $S_i$ is arranged to be directly connected to the voltage source 20 through the emitter-collector path of the switching transistor 23. In this case also the remaining circuit components 24,25 and 26 of FIG. 7 are retained.

Figure 10:
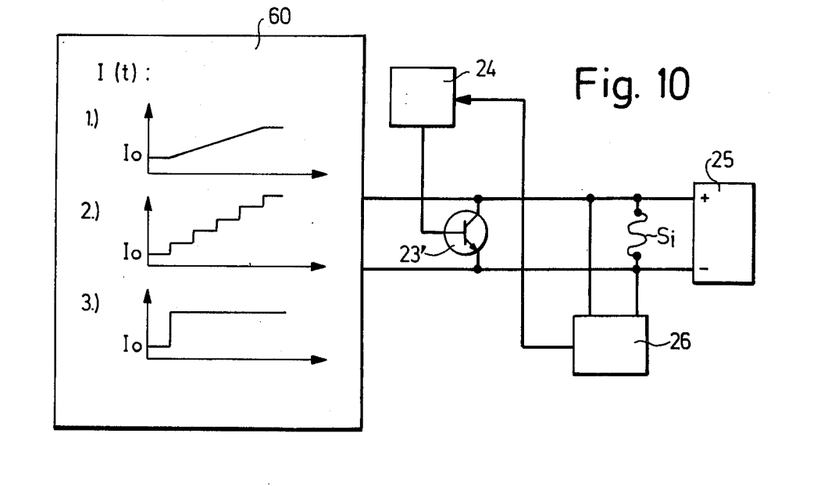

FIG. 10 shows a circuit in which the voltage source 20 is replaced by a current source 60. The output terminals of the current source 60 are bridged by the emitter-collector path of a switching transistor 23', and in addition, are connected directly to the burnout-susceptible strip $S_i$. The current source 60 delivers a current I, the magnitude of which depends upon the time t in the same way as the voltage U of the voltage source 20 varies with time. The remaining circuit components 24,25 and 26 are again the same as in FIGS. 7,8 and 9. This and the other circuits described above make it possible to cause current pulses to flow across the burnout-susceptible strip $S_i$. It is then possible to modify the pulse intensity in dependence upon time in the desired way.

FIGS. 11 through 16 show pulse sequences with which it is particularly advantageous to produce a burnout of the strip $S_i$ with whichever of the above-described circuits may be chosen for use.

Figure 11:
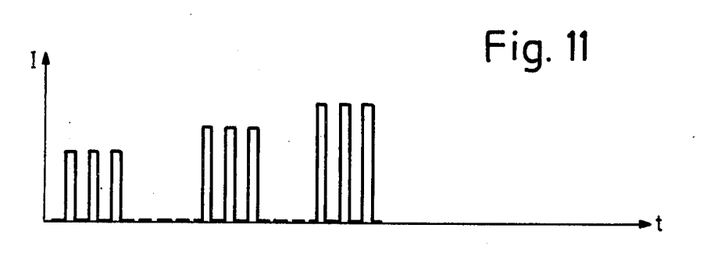
FIGS. 11 through 16 are timing diagrams showing pulse sequences that can be delivered by the circuits shown in FIGS. 7 through 10 for producing selective burnout of the supplementary connection paths provided on an integrated circuit unit.

FIG. 11 shows a succession of series of current pulses with the pulses within each of the series having constant duration and constant frequency. The pulse amplitude is held constant within each of the series, but is increased by a certain amount after the end of every series. These pulse sequences can be obtained by selecting the step function output for the output voltage $U_{(t)}$ of the voltage source 20 or as the output current $I_{(t)}$ of the current source 60, while operating the pulse generator 24 with constant frequency and constant pulse duration.

Figure 12:
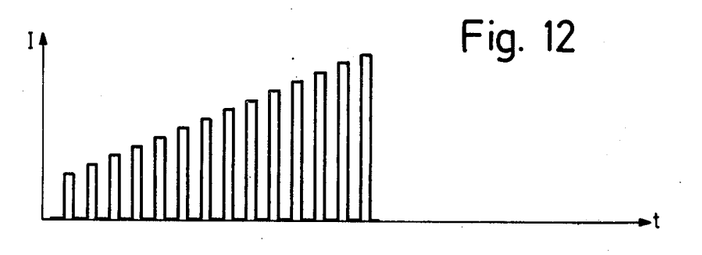

FIG. 12 shows a sequence of individual pulses of constant pulse duration and frequency in which the pulse amplitude increases linearly with time. This pulse sequence is obtained by selecting a linearly increasing output voltage $U_{(t)}$ for the voltage source 20 or a linearly increasing output current $I_{(t)}$ for the current source 60, while operating the pulse generator at constant frequency and constant pulse duration.

Figure 13:
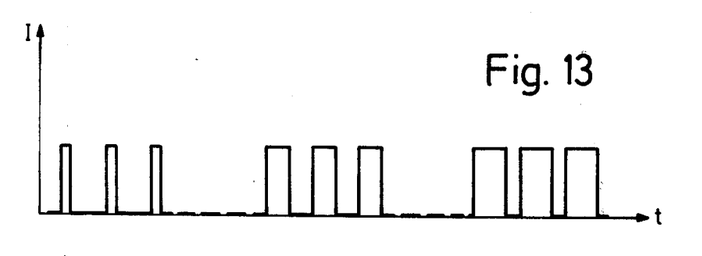

FIG. 3 shows a sequence composed of successive series of current pulses of constant amplitude and frequency. The pulse duration is held constant over each series, but at the end of each series it is increased by a certain amount. Such a pulse sequence is obtained by holding constant the output voltage $U_{(t)}$ of the voltage source 20 or the output current $I_{(t)}$ of the current source 60 and also the frequency of the pulse generator 24, while suddenly increasing the duration of these pulses after particular time intervals (modification of the pulse duration $T_{(t)}$ according to a step function).

Figure 14:
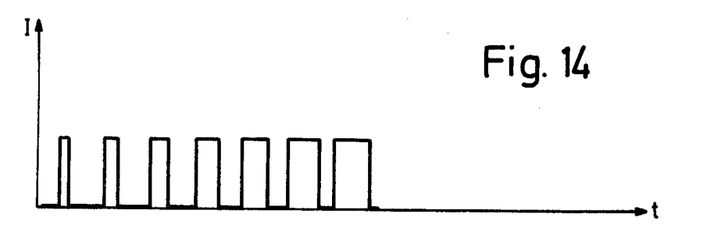

FIG. 14 shows a sequence of individual pulses of constant amplitude and frequency in which the pulse duration increases linearly with time. This pulse sequence is obtained by holding constant the output voltage $U_{(t)}$ of the voltage source 20 or the output current $I_{(t)}$ of the current source 60 and also the frequency of the pulse generator 24, while allowing the pulse duration of these pulses to increase linearly with time.

Figure 15:
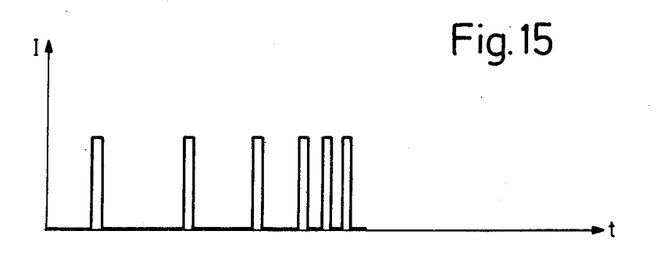

FIG. 15 shows a sequence of individual pulses of constant amplitude and pulse duration, but of increasing frequency. This pulse sequence is obtained by holding constant the output voltage $U_{(t)}$ of the voltage source 20 or the output current $I_{(t)}$ of the current source 60, and also the pulse duration of the pulses delivered by the pulse generator 24, but causing the frequency of these pulses to increase with time.

Figure 16:
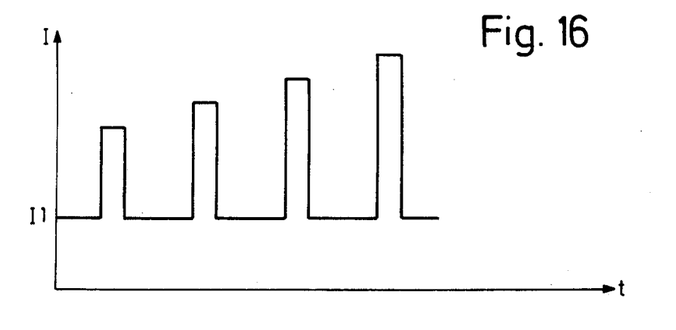

FIG. 16 shows a pulse sequence such as that shown in FIG. 12 with a superimposed constant direct current $I_1$. This direct current is supplied by the constant current source 25. The superposition of a direct current makes it possible to measure the resistance of the strip $S_i$ during the intervals between pulses provided by the pulse generator 24, utilizing measuring means in the measuring circuit 26.

When a capacitor is used as a storage device as in the case of the capacitor 21, an inductance may be used instead of the resistor 22 in its charging path to produce resonant charging at a particular pulse rate. A capacitor can be similarly used with an inductive storage device like the inductor 41 to produce resonant storage.

The supplementary metallic paths used for burnout trimming may be either shunt paths around series incremental elements or series paths in series with shunt incremental elements. In either case they affect the connection of the incremental elements in the circuit, either keeping one out unless interrupted by burnout or keeping on in unless interrupted by burnout.

We claim:

1. A method of burning out a selected conductive connection of an integrated circuit unit having a metallic connection pattern, comprising the step of:

applying a plurality of individual pulses of electrical energy in rapid succession to a selected portion of said metallic connection pattern constituting a selected conductive connection to be burned out, in such a way as to deliver to said selected connection amounts of energy per unit of time that increase with time until said connection is burned out.

2. A method according to claim 1, in which the step of applying pulses of electrical energy is carried out by applying successive series of several individual pulses of constant pulse duration and frequency and of amplitude such that the pulse amplitude is increased after the termination of each series of several individual pulses.

3. A method according to claim 1, in which the step of applying pulses of electrical energy is carried out by applying a series of electrical pulses of constant pulse duration and frequency but of pulse amplitude increasing from pulse to pulse.

4. A method according to claim 1, in which the step of applying pulses of electrical energy is carried out by applying successive series of several individual pulses of constant pulse amplitude and frequency, with the pulse duration such that the pulse duration is increased after the termination of each series of several individual pulses.

5. A method according to claim 1, in which the step of applying pulses of electrical energy is carried out by applying a series of electrical pulses of constant pulse amplitude and frequency but of pulse duration increasing from pulse to pulse.

6. A method according to claim 1, in which the step of applying pulses of electrical energy is carried out by applying a series of several individual pulses of constant pulse amplitude and duration, but of increasing pulse frequency.

7. A method according to claim 1, in which the step of applying pulses of electrical energy is carried out by applying a series of pulses in which at least two of the characteristics of pulse amplitude, pulse duration and pulse frequency are increased with the progress of time.

8. A method according to claim 1, in which the step of applying pulses of electrical energy is carried out while superimposing a constant direct current ($I_1$) upon the applied pulses of electrical energy.

9. A method according to claim 1, in which the step of applying pulses of electrical energy is continued for the application of several supplementary pulses after said connection is interrupted by burnout.

10. A method according to claim 1, operated repeatedly for burning out a succession of selected conductive connections of an integrated circuit, in which the step of applying pulses of electrical energy is in each case carried out by applying a succession of pulses of which the first has an energy content of a predetermined value selected to be not greater than the energy content barely capable of burning out the most easily burned out one of the selected conductive connections to be burned out.

11. A method according to claim 1, operated repeatedly for burning out a succession of selected conductive connections of an integrated circuit, in which the step of applying pulses of electrical energy is in each case carried out by applying a succession of pulses of which the first has an energy content of a predetermined value selected to be less than the energy content necessary to burn out at once the most easily burned out connection of said selected conductive connections to be burned out.

12. A method of providing an electrical resistance of a magnitude within a predetermined resistance range in an integrated circuit unit, comprising the steps of:

providing in said integrated circuit a plurality of parallel resistance paths connected together by metallic connection paths which are part of the metallic connection path pattern of the integrated circuit unit;

burning out a portion of one of said metallic connection paths so as to disconnect at least one of said parallel resistances by applying to said metallic path portion a plurality of individual pulses of electrical energy in rapid succession in such a way as to deliver increasing amounts of energy per units of time until said path is interrupted by burn-out;

measuring the effective resistance of said remaining parallel resistance paths after disconnection as aforesaid, and repeating the burnout disconnecting step and the measuring step until the effective resistance of the remaining parallel resistance paths is within said predetermined range.

13. A method according to claim 12, in which the step of applying pulses of electrical energy to a connection path is carried out with the simultaneous application of a superimposed direct current to said connection path and in which such superimposed direct current ($I_1$) is utilized for measuring the effective resistance of the remaining parallel combination of resistances.

14. A method according to claim 12, in which each step of applying pulses of electric energy as aforesaid is followed by the application of at least one further pulse of electric energy of the same succession of pulses after the path to which the pulses were being applied has been interrupted by burnout.

* * * * *